(12) United States Patent
Ryu et al.

(10) Patent No.: US 8,497,726 B2
(45) Date of Patent: Jul. 30, 2013

(54) LEVEL SHIFTER

(75) Inventors: Beom-seon Ryu, Cheongju-si (KR); Gyu-ho Lim, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 1 day.

(21) Appl. No.: 13/398,306

(22) Filed: Feb. 16, 2012

(65) Prior Publication Data

US 2012/0212281 A1    Aug. 23, 2012

(30) Foreign Application Priority Data

Feb. 18, 2011    (KR) .................. 10-2011-0014796

(51) Int. Cl.
*H03L 5/00* (2006.01)

(52) U.S. Cl.
USPC ............................ 327/333; 326/68; 326/81

(58) Field of Classification Search
USPC ............. 327/108, 333, 427; 326/68, 80, 81; 365/189.11
See application file for complete search history.

(56) References Cited

U.S. PATENT DOCUMENTS

| 7,009,424 B2* | 3/2006 | Khan et al. .................. 326/81 |
| 7,683,667 B2* | 3/2010 | Kim .......................... 326/63 |
| 2005/0275429 A1* | 12/2005 | Khan et al. .................. 326/81 |

OTHER PUBLICATIONS

Garg, Rajesh et al., "A Single-supply True Voltage Level Shifter," 2008, EDAA, (6 pages, in English).
Khan, Qadeer A. et al., "A Single Supply Level Shifter for Multi-Voltage Systems," Proceedings of the 19th International Conference on VLSI Design, 2006, IEEE Computer Society, (4 pages, in English).

* cited by examiner

*Primary Examiner* — Long Nguyen
(74) *Attorney, Agent, or Firm* — NSIP Law

(57) ABSTRACT

A level shifter is provided. The level shifter includes a signal converter connected to an external power source and a ground, first and second output terminals connected to the signal converter, the first and second output terminals being configured to output a bias voltage applied from the external power source, and a switching unit configured to switch a connection state of the signal converter according to an input signal to adjust output voltage values of the first and second output terminals, the switching unit including first and second transistors, the first transistor being of a type that is different from a type of the second transistor, the first and second transistors being connected to each other in series between an input terminal, to which an input signal is applied, and the external power source, gates of the first and second transistors being commonly connected to the second output terminal.

9 Claims, 4 Drawing Sheets

LEVEL SHIFTER

CROSS-REFERENCE TO RELATED APPLICATION

This application claims the benefit under 35 U.S.C. §119(a) of Korean Patent Application No. 10-2011-0014796 filed on Feb. 18, 2011, in the Korean Intellectual Property Office, the entire disclosure of which is incorporated herein by reference for all purposes.

BACKGROUND

1. Field

The following description relates to a level shifter, and, for example, to a level shifter having a single power source.

2. Description of Related Art

In a system on chip (SOC) in which a circuit system formed of combinations of various types of semiconductor circuits is realized in a chip form, a block requiring a high performance uses a high voltage, and a block requiring a low performance uses a low voltage to save energy. Since the blocks use different types of voltages, a leakage current may increase or problems may occur in functions of the blocks in an interface section between the blocks.

In order to solve this problem, a level shifter, which converts a voltage supplied from an external source into a high level voltage or a low level voltage, is used as an interface circuit to change a voltage level between the blocks.

FIG. 1 is a circuit diagram illustrating a conventional level shifter. Referring to FIG. 1, the conventional level shifter receives an input signal in having a relatively low level voltage vdd and performs level shifting with respect to the input signal in to output an output signal out having a relatively high level voltage vdda. For example, if the input signal in has the high level voltage vdd, transistors MN1 and MP2 are respectively turned on, thereby outputting the output signal out having the high level voltage vdda. If the input signal in has a low level voltage vss, transistors MN2 and MP1 are respectively turned on, thereby outputting an output signal having a low level voltage vss.

However, since these transistors are to apply additional power to inverters that are to invert an input signal, the number of power pins increases, thereby increasing the number of pins. Therefore, manufacturing cost of a level shifter increases, and a design of the level shifter is increasingly complicated.

SUMMARY

In one general aspect, there is provided a level shifter, including a signal converter connected to an external power source and a ground, first and second output terminals connected to the signal converter, the first and second output terminals being configured to output a bias voltage applied from the external power source, and a switching unit configured to switch a connection state of the signal converter according to an input signal to adjust output voltage values of the first and second output terminals, the switching unit including first and second transistors, the first transistor being of a type that is different from a type of the second transistor, the first and second transistors being connected to each other in series between an input terminal, to which an input signal is applied, and the external power source, gates of the first and second transistors being commonly connected to the second output terminal, and a third transistor disposed between the input terminal and the first output terminal, a gate of the third transistor being connected to a first connection node disposed between the first and second transistors.

A general aspect of the level shifter may further provide that, if the input signal applied to the input terminal is a high level input signal, the first transistor is turned on, and if the input signal applied to the input terminal is a low level input signal, the third transistor is turned on.

A general aspect of the level shifter may further provide that the first transistor is a p-type metal oxide semiconductor (PMOS) transistor, and the second and third transistors are n-type metal oxide semiconductor (NMOS) transistors.

A general aspect of the level shifter may further provide that the signal converter includes fourth and fifth transistors disposed to make a pair and commonly connected to the external power source, a sixth transistor connected between the fourth transistor and the ground, the third transistor being disposed between a second connection node, disposed between the fourth and sixth transistors, and the input terminal, the second connection node being connected to the first output terminal, the gates of the first and second transistors being commonly connected to a gate of the sixth transistor, and a seventh transistor connected between the fifth transistor and the ground and to the input terminal, a third connection node, disposed between the fifth and seventh transistors, being connected to the second output terminal.

A general aspect of the level shifter may further provide that the fourth and fifth transistors are PMOS transistors, and the sixth and seventh transistors are NMOS transistors.

A general aspect of the level shifter may further provide that the first and second output terminals respectively include inverters that invert and output a bias voltage applied from the external power source.

In another general aspect, there is provided a level shifter, including first and second transistors connected to each other in series between an input terminal, to which an input signal is applied, and an external power source, the first transistor being of a type that is different from a type of the second transistor, a third transistor including a gate connected to a first connection node disposed between the first and second transistors, fourth and fifth transistors disposed to make a pair and commonly connected to the external power source, a sixth transistor connected between the fourth transistor and a ground, the third transistor being disposed between a second connection node, disposed between the fourth and sixth transistors, and the input terminal, the second connection node being connected to a first output terminal, the gates of the first and second transistors being commonly connected to a gate of the sixth transistor, and a seventh transistor connected between the fifth transistor and the ground and to the input terminal, a third connection node disposed between the fifth and seventh transistors being connected to a second output terminal.

Another general aspect of the level shifter may further provide that the second through fifth transistors are PMOS transistors, and the first, sixth, and seventh transistors are NMOS transistors.

Another general aspect of the level shifter may further provide that the first and second output terminals respectively include inverters that invert and output a bias voltage applied from the external power source.

Other features and aspects may be apparent from the following detailed description, the drawings, and the claims.

Figure 1:
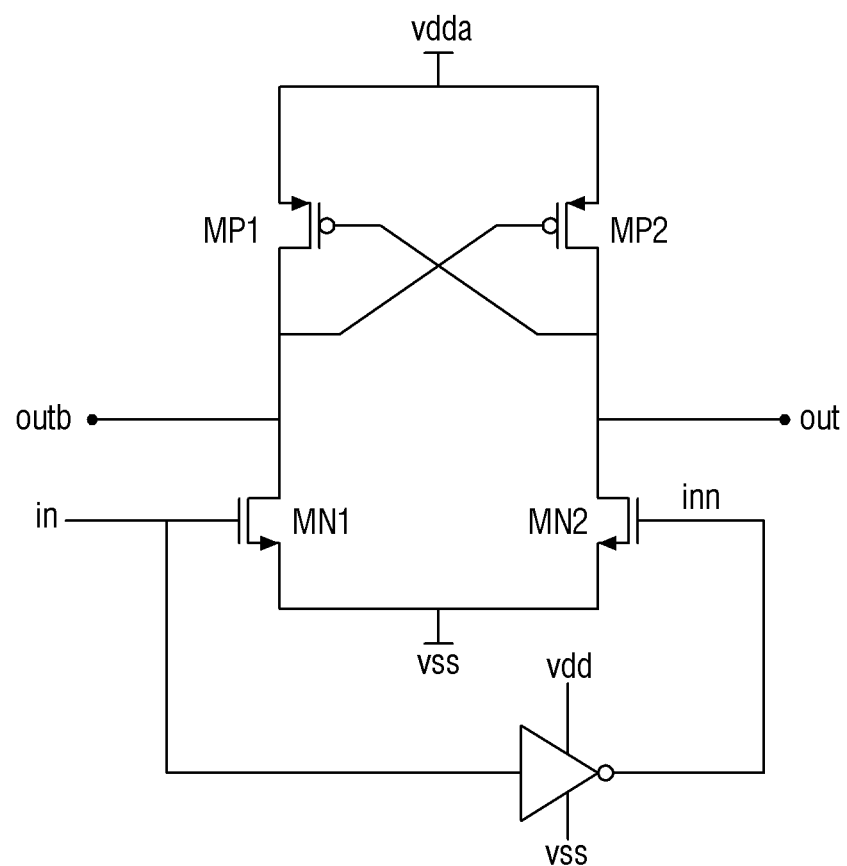
FIG. 1 is a circuit diagram illustrating a conventional level shifter.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the apparatuses described herein. Accordingly, various changes, modifications, and equivalents of the apparatuses described herein will be suggested to those of ordinary skill in the art. Also, descriptions of well-known functions and constructions may be omitted for increased clarity and conciseness.

Figure 2:
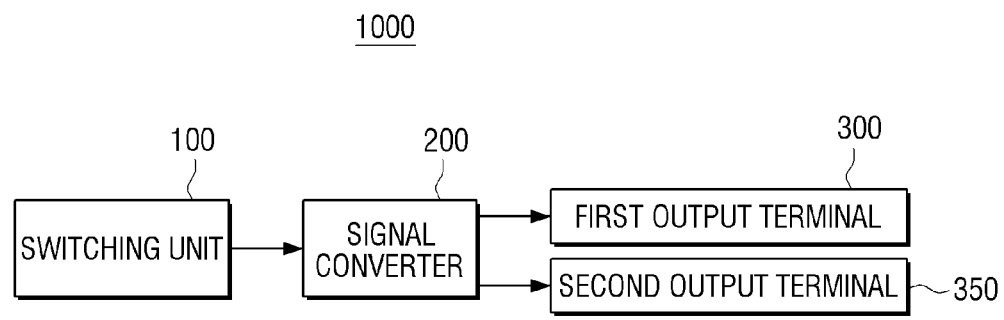
FIG. 2 is a block diagram illustrating an example of a structure of a level shifter according to a general aspect.
Figure 3:
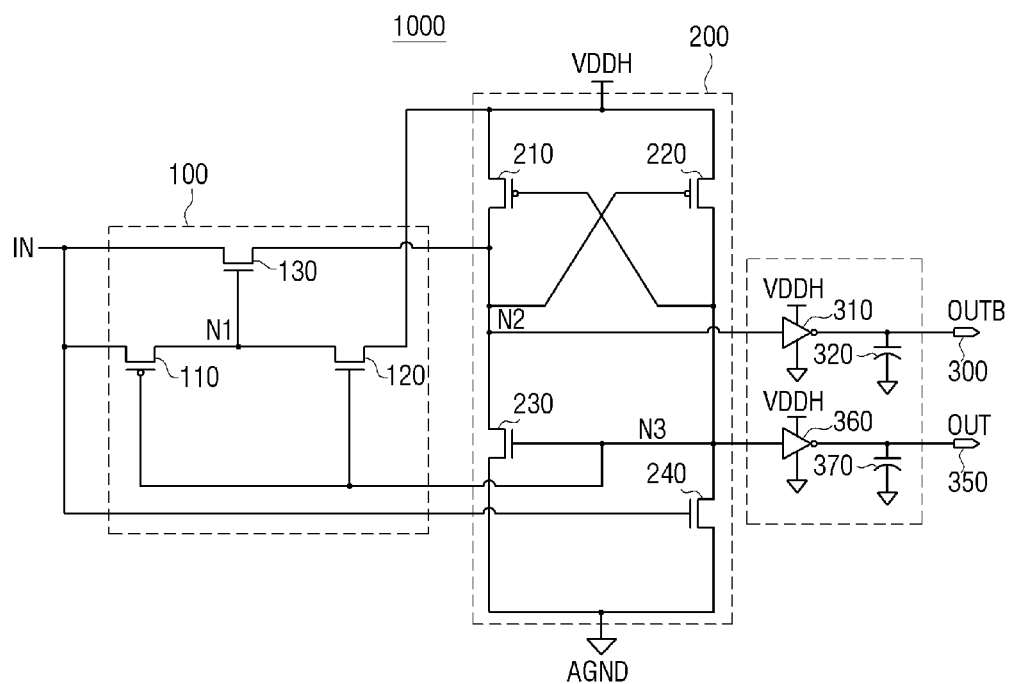
FIG. 3 is a circuit diagram illustrating an example of the level shifter according to a general aspect.

FIG. 2 is a block diagram illustrating an example of a structure of a level shifter 1000 according to a general aspect. FIG. 3 is a circuit diagram illustrating an example of the level shifter 1000 according to a general aspect. Referring to FIG. 2, the level shifter 1000 includes a switching unit 100, a signal converter 200, and first and second output terminals 300 and 350. The switching unit 100 is connected to an input terminal IN to receive an input signal and switches a connection state of the signal converter 200 according to the input signal in order to adjust output voltage values of the first and second output terminals 300 and 350.

The signal converter 200 is connected to an external power source VDDH and the ground AGND and transmits the external power source VDDH and a ground voltage to the first and second output terminals 300 and 350 according to a switching operation of the switching unit 100. Here, an intensity of the external power source VDDH may be greater or less than a voltage intensity of the input signal.

The first and second output terminals 300 and 350 are connected to the signal converter 200 to output a bias voltage that is applied from the external power source VDDH. For example, the first and second output terminals 300 and 350 may respectively output the external power source VDDH and the ground voltage.

Referring to FIG. 3, the level shifter 1000 includes a plurality of p-type metal oxide semiconductor (PMOS) transistors or a plurality of n-type metal oxide semiconductor (NMOS) transistors. The level shifter 1000 also receives the input signal from the input terminal IN to output the external power source VDDH or the ground voltage to the first and second output terminals 300 and 350.

The switching unit 100 includes first, second, and third transistors 110, 120, and 130. For example, the first and second transistors 110 and 120 are connected to each other in series between the input terminal IN, to which the input signal is applied, and the external power source VDDH. A drain of the first transistor 110 and a source of the second transistor 120 are commonly connected to each other to form a connection node N1. Gates of the first and second transistors 110 and 120 are commonly connected to the second output terminal 350.

The third transistor 130 is disposed between the input terminal IN, to which the input signal is applied, and the first output terminal 300. For example, a source of the third transistor 130 is connected to the input terminal IN, and a drain of the third transistor 130 is connected to the first output terminal 350. A gate of the third transistor 130 is connected to the connection node N1 that is formed through the common connection between the drain of the first transistor 110 and the source of the second transistor 120.

The first transistor 110 may be a different type of transistor from the second and third transistors 120 and 130. For example, the first transistor 110 may be a PMOS transistor, and the second and third transistors 120 and 130 may be NMOS transistors.

A ratio between a width and a length of the first transistor 110 may be 0.8 μm/2 μm. A ratio between a width and a length of the second transistor 120 may be 4 μm/0.5 μm. A ratio between a width and a length of the third transistor 130 may be 2 μm/0.5 μm.

The signal converter 200 is connected to the external power source VDDH and the ground AGND and includes fourth, fifth, sixth, and seventh transistors 210, 220, 230, and 240. The fourth and fifth transistors 210 and 220 are disposed to make a pair to be commonly connected to the external power source VDDH. For example, sources of the fourth and fifth transistors 210 and 220 are connected to a connection node to which the external power source VDDH and the drain of the second transistor 120 are commonly connected. In addition, a gate of the fourth transistor 210 is connected to a connection node to which a drain of the fifth transistor 220, the gate of the first transistor 110, and the second output terminal 350 are commonly connected. A gate of the fifth transistor 220 is connected to a connection node to which a drain of the fourth transistor 210, the drain of the third transistor 130, and the first output terminal 300 are commonly connected.

The sixth transistor 230 is connected between the fourth transistor 210 and the ground AGND. For example, a drain of the sixth transistor 230 is connected to the drain of the fourth transistor 210, and a gate of the sixth transistor 230 is connected to a connection node to which the gates of the first and second transistors 110 and 120 are commonly connected. A source of the sixth transistor 230 is connected to the ground AGND.

The seventh transistor 240 is connected between the fifth transistor 220 and the ground AGND. For example, a drain of the seventh transistor 240 is connected to the drain of the fifth transistor 220, and a gate of the seventh transistor 240 is connected to the input terminal IN. A source of the seventh transistor 240 is connected to the ground AGND.

The fourth and fifth transistors 210 and 220 may be different types of transistors from the sixth and seventh transistors 230 and 240. For example, the fourth and fifth transistors 210 and 220 may be PMOS transistors, and the sixth and seventh transistors 230 and 240 may be NMOS transistors.

A ratio between a width and a length of each of the fourth and fifth transistors 210 and 220 may be 0.8 μm/1 μm, and a ratio between a width and a length of each of the sixth and seventh transistors 230 and 240 may be 3 μm/0.5 μm.

The first and second output terminals 300 and 350 are connected to the signal converter 200 to output the bias voltage that is applied from the external power source VDDH. For example, the first output terminal 300 is connected to a connection node to which the drains of the fourth and sixth transistors 210 and 230 are commonly connected. In addition, the second output terminal 350 is connected to a connection node to which the drains of the fifth and seventh transistors 220 and 240 are commonly connected.

The first and second output terminals 300 and 350 respectively include inverters 310 and 360 that invert and output the bias voltage applied from the external power source VDDH.

Since the inverters 310 and 360 operate at the same power supply voltage VDDH as the external power source VDDH, the first and second output terminals 300 and 350 may respectively output output signals OUTB and OUT having the same phase as the input signal by using the inverters 310 and 360. In addition, the first and second output terminals 300 and 350 respectively include capacitors 320 and 370 that store the bias voltage applied from the external power source VDDH.

Figure 4:
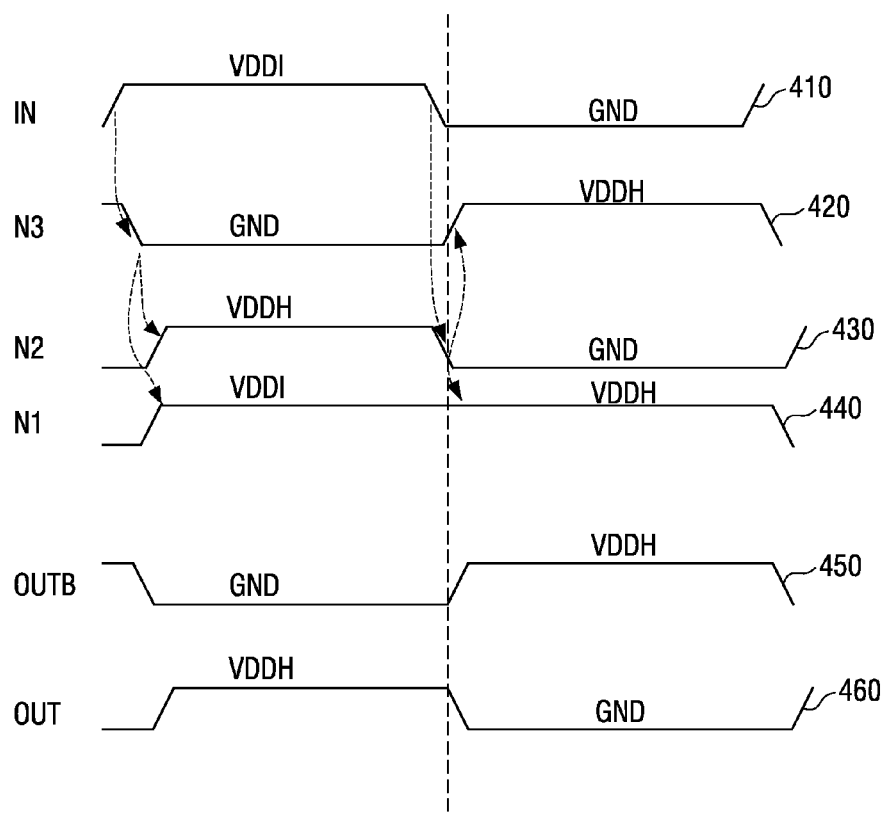
FIG. 4 is a view illustrating examples of waveforms to explain an operation of the level shifter, according to a general aspect.

An example operation of the level shifter 1000 will now be described with reference to FIG. 4. FIG. 4 is a view illustrating examples of waveforms to explain an operation of the level shifter 1000, according to a general aspect.

Referring to a first section of FIG. 4, if an input signal input from the input terminal IN has a high level VDDI (410), a high level is applied to the gate of the seventh transistor 240. Therefore, the seventh transistor 240 is turned on, and a node N3 is in a ground state GND (420). As a result, a ground voltage is applied to the gate of the fourth transistor 210, thereby turning on the fourth transistor 210 and applying an external voltage VDDH to a node N2 (430). Therefore, the ground voltage applied to the node N3 is inverted by the inverter 360 to output the external voltage VDDH to the second output terminal 350 (460). The external voltage VDDH applied to the node N2 is inverted by the inverter 310 to output the ground voltage to the first output terminal 300 (450). In addition, since the node N3 is in the ground state GND, the ground voltage is applied to the gate of the first transistor 110, thereby turning on the first transistor 110. Therefore, the high level of the input signal is applied to the node N1 (440).

Referring to a second section of FIG. 4, if the input signal input from the input terminal IN has a low level GND (410), the third transistor 130 is turned on, thereby discharging the external voltage VDDH applied to the node N2 through the third transistor 130 and applying the low level GND to the node N2 (430). Therefore, the ground voltage is applied to the gate of the fifth transistor 220, thereby turning on the fifth transistor 220 and applying the external voltage VDDH to the node N3. As a result, the external voltage VDDH applied to the node N3 is inverted by the inverter 360 so as to output the ground voltage to the second output terminal 350 (460). The ground voltage applied to the node N2 is inverted by the inverter 310 to output the external voltage VDDH to the first output terminal 300 (450). In addition, since the external voltage VDDH is applied to the node N3, the external voltage VDDH is applied to the gates of the first and second transistors 110 and 120. Therefore, the first transistor 110 is turned off, the second transistor 120 is turned on, and the external voltage VDDH is applied to the node N1 (440).

Since the node N3 is in the ground state GND, the ground voltage is also applied to the gate of the first transistor 110, thereby turning on the first transistor 110. Therefore, the high level of the input signal is applied to the node N1 (440).

According to the teachings above, there is provided a level shifter that may use a single power source to convert a level of an input signal into a high voltage level or a low voltage level, thereby reducing a required number of power pins and manufacturing cost.

In addition, the level shifter may perform only a switching operation through the switching unit without using an additional storage device to output an external power source or a ground voltage according to an input signal. Therefore, the level shifter may be prevented from malfunctioning due to a leakage current generated by using the storage device. As such, the level shifter may be widely used without limiting a frequency of the input signal.

A number of examples have been described above. Nevertheless, it will be understood that various modifications may be made. For example, suitable results may be achieved if components in a described system, architecture, device, or circuit are combined in a different manner and/or replaced or supplemented by other components or their equivalents. Accordingly, other implementations are within the scope of the following claims.

What is claimed is:

1. A level shifter, comprising:
   a signal converter connected to an external power source and a ground;
   first and second output terminals connected to the signal converter, the first and second output terminals being configured to output a bias voltage applied from the external power source; and
   a switching unit configured to switch a connection state of the signal converter according to an input signal to adjust output voltage values of the first and second output terminals, the switching unit comprising:
      first and second transistors, the first transistor being of a type that is different from a type of the second transistor, the first and second transistors being connected to each other in series between an input terminal, to which an input signal is applied, and the external power source, gates of the first and second transistors being commonly connected to the second output terminal; and
      a third transistor disposed between the input terminal and the first output terminal, a gate of the third transistor being connected to a first connection node disposed between the first and second transistors.

2. The level shifter as claimed in claim 1, wherein:
   if the input signal applied to the input terminal is a high level input signal, the first transistor is turned on; and
   if the input signal applied to the input terminal is a low level input signal, the third transistor is turned on.

3. The level shifter as claimed in claim 1, wherein the first transistor is a p-type metal oxide semiconductor (PMOS) transistor, and the second and third transistors are n-type metal oxide semiconductor (NMOS) transistors.

4. The level shifter as claimed in claim 1, wherein the signal converter comprises:
   fourth and fifth transistors disposed to make a pair and commonly connected to the external power source;
   a sixth transistor connected between the fourth transistor and the ground, the third transistor being disposed between a second connection node, disposed between the fourth and sixth transistors, and the input terminal, the second connection node being connected to the first output terminal, the gates of the first and second transistors being commonly connected to a gate of the sixth transistor; and
   a seventh transistor connected between the fifth transistor and the ground and to the input terminal, a third connection node, disposed between the fifth and seventh transistors, being connected to the second output terminal.

5. The level shifter as claimed in claim 4, wherein the fourth and fifth transistors are PMOS transistors, and the sixth and seventh transistors are NMOS transistors.

6. The level shifter as claimed in claim 1, wherein the first and second output terminals respectively comprise inverters that invert and output a bias voltage applied from the external power source.

7. A level shifter, comprising:
   first and second transistors connected to each other in series between an input terminal, to which an input signal is applied, and an external power source, the first transistor being of a type that is different from a type of the second transistor;

a third transistor comprising a gate connected to a first connection node disposed between the first and second transistors;

fourth and fifth transistors disposed to make a pair and commonly connected to the external power source;

a sixth transistor connected between the fourth transistor and a ground, the third transistor being disposed between a second connection node, disposed between the fourth and sixth transistors, and the input terminal, the second connection node being connected to a first output terminal, the gates of the first and second transistors being commonly connected to a gate of the sixth transistor; and a seventh transistor connected between the fifth transistor and the ground and to the input terminal, a third connection node disposed between the fifth and seventh transistors being connected to a second output terminal.

8. The level shifter as claimed in claim 7, wherein:

the first, fourth, and fifth transistors are PMOS transistors; and the second, third, sixth, and seventh transistors are NMOS transistors.

9. The level shifter as claimed in claim 7, wherein the first and second output terminals respectively comprise inverters that invert and output a bias voltage applied from the external power source.

* * * * *